United States Patent
Lee

(10) Patent No.: US 6,846,713 B1
(45) Date of Patent: Jan. 25, 2005

(54) METHOD FOR MANUFACTURING A NONVOLATILE MEMORY TRANSISTOR

(75) Inventor: Da-soon Lee, Chungcheongbuk-do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/827,456

(22) Filed: Apr. 19, 2004

(30) Foreign Application Priority Data

Jul. 21, 2003 (KR) .............................. 10-2003-0049941

(51) Int. Cl.$^7$ ............................................. H01L 21/336
(52) U.S. Cl. ...................... 438/259; 438/258; 438/266
(58) Field of Search ................................. 438/257–267

(56) References Cited

U.S. PATENT DOCUMENTS

| | | | |
|---|---|---|---|
| 5,973,352 A | 10/1999 | Noble | |
| 6,238,976 B1 | 5/2001 | Noble et al. | |
| 6,583,466 B2 * | 6/2003 | Lin et al. .................... | 257/314 |

* cited by examiner

Primary Examiner—Jack Chen
(74) Attorney, Agent, or Firm—Marshall, Gerstein & Borun LLP

(57) ABSTRACT

The present invention discloses a method for manufacturing a nonvolatile memory transistor capable of minimizing the area when adapted to the technology of sub-micron. The method comprises the steps of forming a trench of a predetermined shape on a silicon substrate; forming a N+ type doped region; etching the silicon substrate; forming ion implanted regions on the sides of the trench by conducting an inclined ion implantation for threshold voltage Vt control ion implantation of a select transistor; forming a poly-1 layer by depositing an oxide film and then depositing poly-1 serving as a gate node of the select transistor, after the formation of the poly-1 layer, conducting an etchback to the poly-1 layer, forming N+ ion implanted regions by conducting a N-type ion implantation in order to form a N+ source junction of a cell transistor; forming a channel of an EEPROM by additionally etching the silicon substrate; forming cell threshold voltage ion implanted regions by conducting an ion implantation in order to control the threshold voltage Vt of the channel of the cell; after the cell threshold voltage ion implantation, forming a cell gate oxide film by conducting the gate oxidation of the cell; forming a poly-2 layer by depositing poly-2 and then conducting an etchback; forming cell N-type drain junction regions by conducting an ion implantation in order to form a cell N-type drain junction; etching the poly-2 layer into a predetermined shape in order to form a control gate of the cell overlapped with the poly-2; forming a ply-3 layer by depositing an oxide film, depositing poly-3 and conducting an etchback; and filling an oxide film so as to be penetrated into the poly-3 layer, the oxide film, the poly-2 layer, the cell gate oxide film, the poly-1 layer and the oxide film under the poly-1 layer.

3 Claims, 7 Drawing Sheets

METHOD FOR MANUFACTURING A NONVOLATILE MEMORY TRANSISTOR

BACKGROUND OF THE INVENTION

1. Field of the Invention

The present invention relates to a method for manufacturing a semiconductor device, and more particularly, to a method for manufacturing a nonvolatile memory transistor which is capable of mnimizing the area when adapted to the technology of a sub-micron.

2. Description of the Related Art

FIG. 1 is a cross sectional view for explaining the bias condition of an electrically erasable and programmable read only memory (EEPROM) structure manufactured according to the prior art.

The operation of the EEPROM structure for program, erase and read is shown in the following Table 1.

TABLE 1

| Condition | V_drain | V_select gate | V_control gate | V_source | V_sub | Method |
|---|---|---|---|---|---|---|
| Program | GND | Higher than ~10 V | Higher than ~10 V | Floating | GND | F-N Tunneling |
| Erase | Higher than ~10 V | Higher than ~10 V | GND | Floating | GND | F-N Tunneling |
| Read | ~1 V | Vcc | Vcc | GND | GND | — |

As shown in FIG. 1 and Table 1, high temperature electrons are implanted to poly-1 by the F-N tunnel method along a tunnel window by the bias applied upon programming. By this, the threshold voltage Vt is increased to form an off-transistor upon reading. Additionally, the high temperature electrons flow out from poly-1 by the F-N tunnel method along the tunnel window by the bias applied upon erasing, and thus the cell threshold voltage Vt is lowered to form a turn-on transistor.

In this way, an EEPROM cell having a select transistor has a relatively large unit cell area, thus, as the unit cell area is lowered to below sub-microns, the competitive power for cell size is lowered, so it is difficult to reduce the cell size.

SUMMARY OF THE INVENTION

The present invention is designed in consideration of the problems of the prior art, and therefore it is an object of the present invention to provide a method for manufacturing a nonvolatile memory transistor capable of minimizing the area when adapted to the technology for sub-microns.

To achieve the above object, there is provided a method for manufacturing a nonvolatile memory transistor according to the present invention, comprising the steps of: forming a trench of a predetermined shape on a silicon substrate; forming a N+ type doped region; etching the silicon substrate; forming ion implanted regions on the sides of the trench by conducting an inclined ion implantation for threshold voltage Vt control ion implantation of a select transistor, forming a poly-1 layer by depositing an oxide film and then depositing poly-1 serving as a gate node of the select transistor; after the formation of the poly-1 layer, conducting an etchback to the poly-1 layer; forming N+ ion implanted regions by conducting a N-type ion implantation in order to form a N+ source junction of a cell transistor; forming a channel of an EEPROM by additionally etching the silicon substrate; forming cell threshold voltage ion implanted regions by conducting an ion implantation in order to control the threshold voltage Vt of the channel of the cell; after the cell threshold voltage ion implantation, forming a cell gate oxide film by conducting the gate oxidation of the cell; forming a poly-2 layer by depositing poly-2 and then conducting an etchback; forming cell N-type drain junction regions by conducting an ion implantation in order to form a cell N-type drain junction; etching the poly-2 layer into a predetermined shape in order to form a control gate of the cell overlapped with the poly-2; forming a ply-3 layer by depositing an oxide film, depositing poly-3 and conducting an etchback; and filling an oxide film so as to be penetrated into the poly-3 layer, the oxide film, the poly-2 layer, the cell gate oxide film, the poly-1 layer and the oxide film under the poly-1 layer.

BRIEF DESCRIPTION OF THE DRAWINGS

Other objects and aspects of the present invention will become apparent from the following description of embodiments with reference to the accompanying drawing in which.

DESCRIPTION OF THE PREFERRED EMBODIMENT

Figure 1:
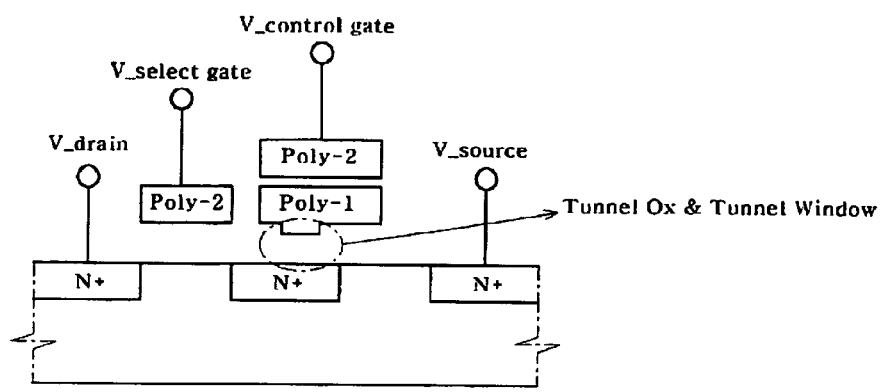
FIG. 1 is a cross sectional view for explaining the bias condition of an electrically erasable and programmable read only memory (EEPROM) structure manufactured according to the prior art.

Hereinafter, a preferred embodiment of the present invention will be described in more detail referring to the drawings. In addition, the following embodiment is for illustration only, not intended to limit the scope of the invention.

Figure 2A:
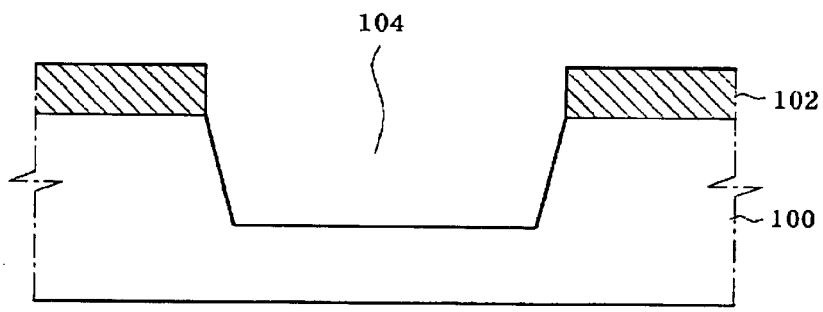
FIGS. 2a to 2r are cross sectional views for explaining a method for manufacturing a nonvolatile memory transistor according to a preferred embodiment of the present invention.
Figure 2B:
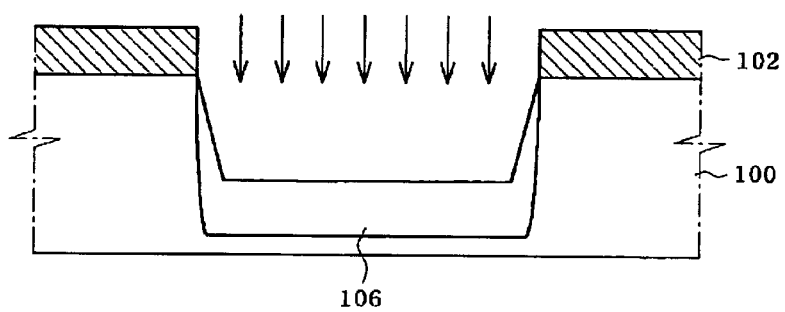
Figure 2C:
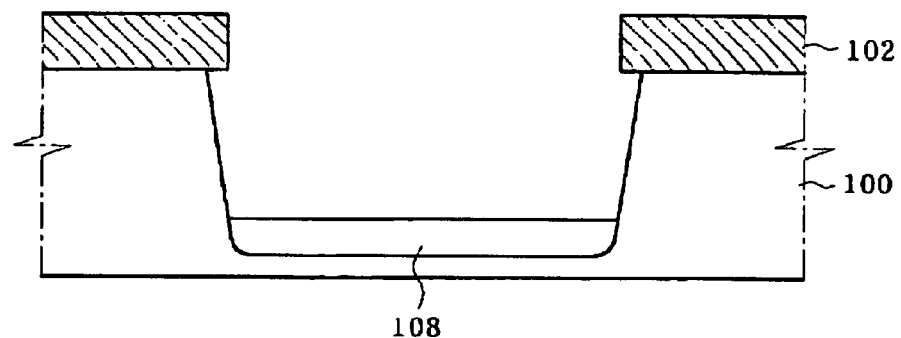
Figure 2D:
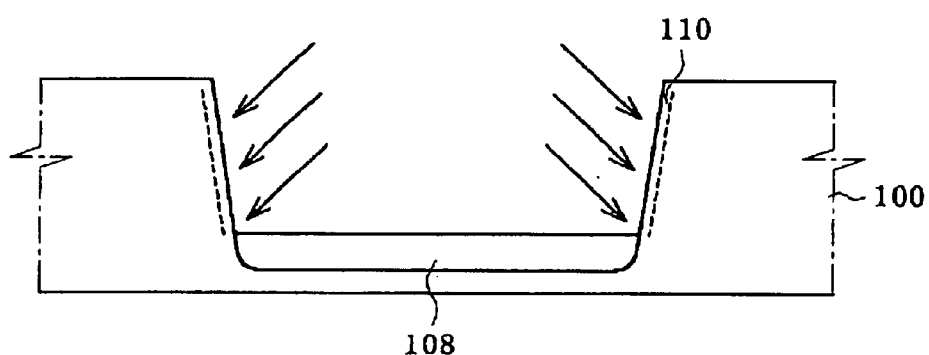
Figure 2E:
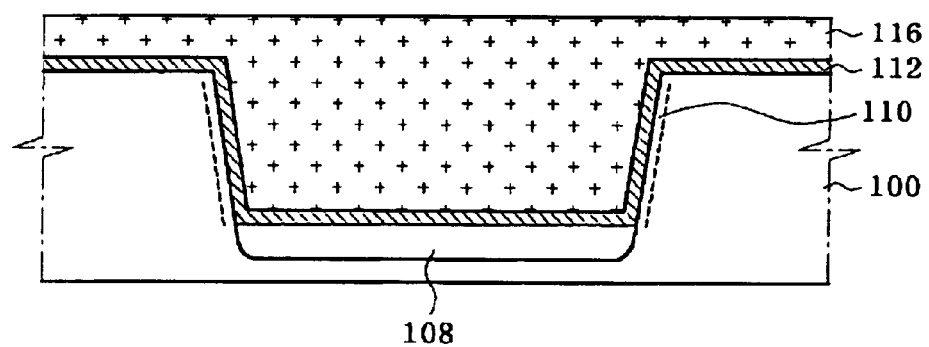
Figure 2F:
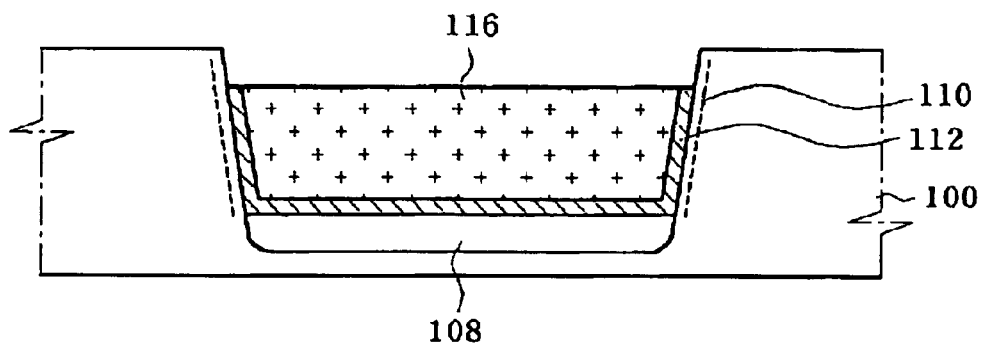
Figure 2G:
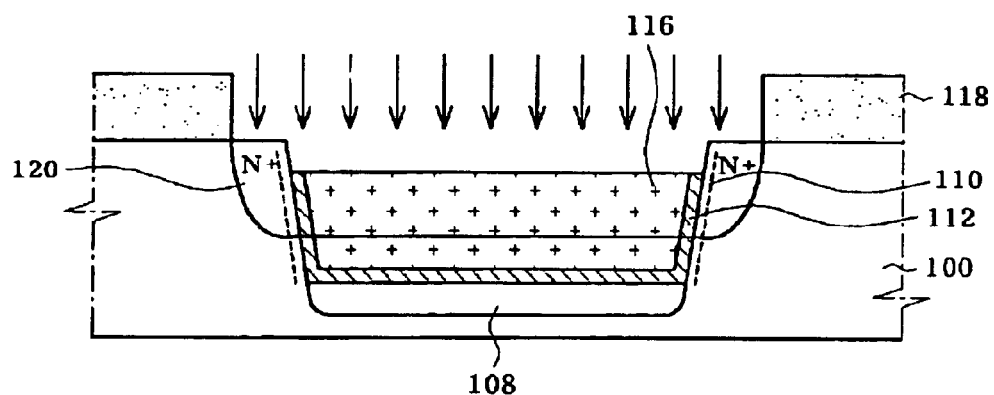
Figure 2H:
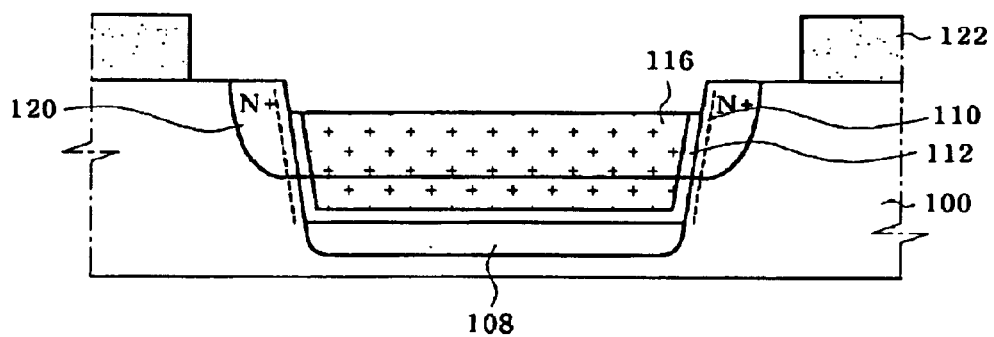
Figure 2I:
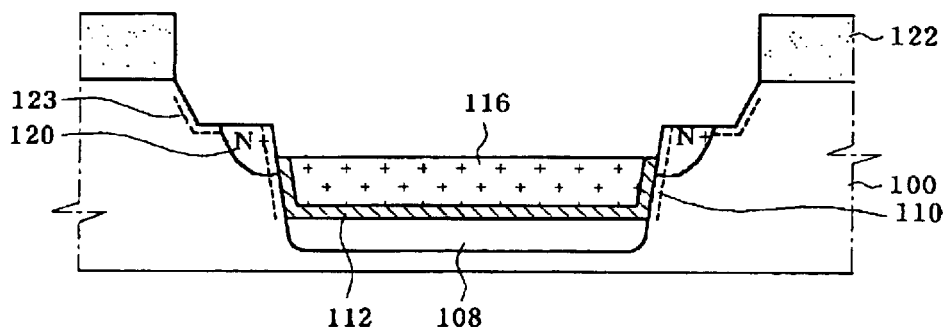
Figure 2J:
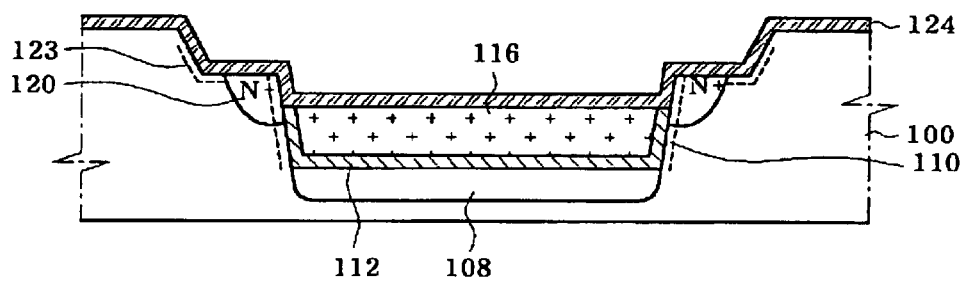
Figure 2K:
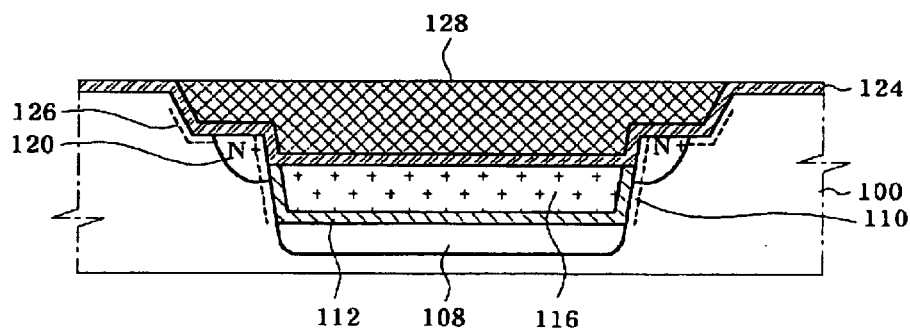
Figure 2L:
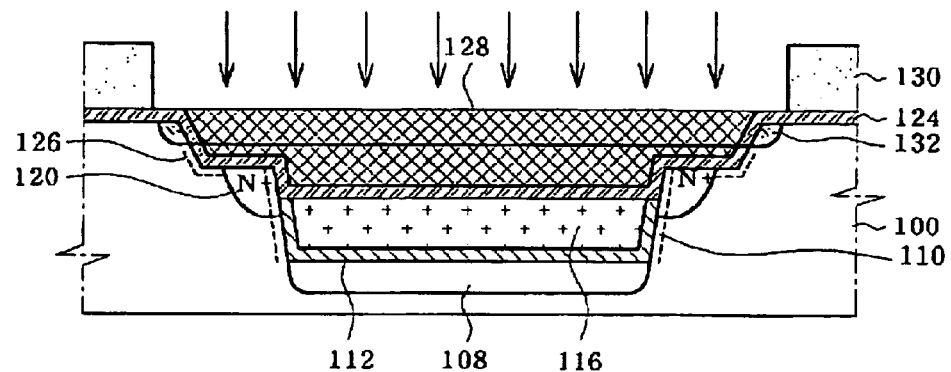
Figure 2M:
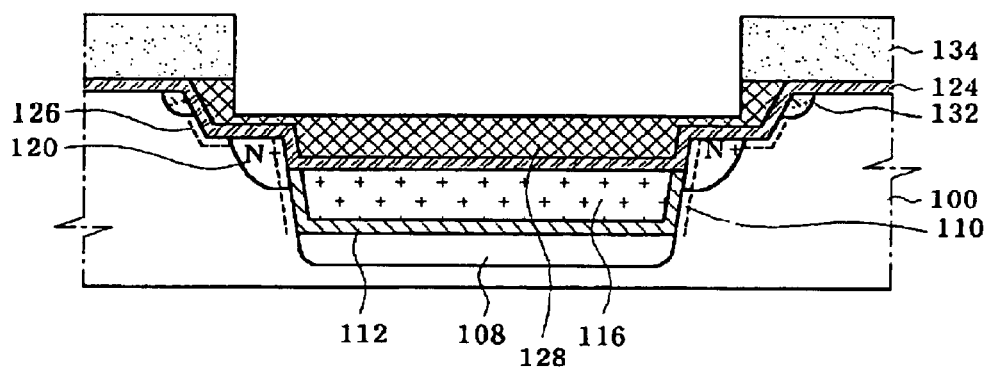
Figure 2N:
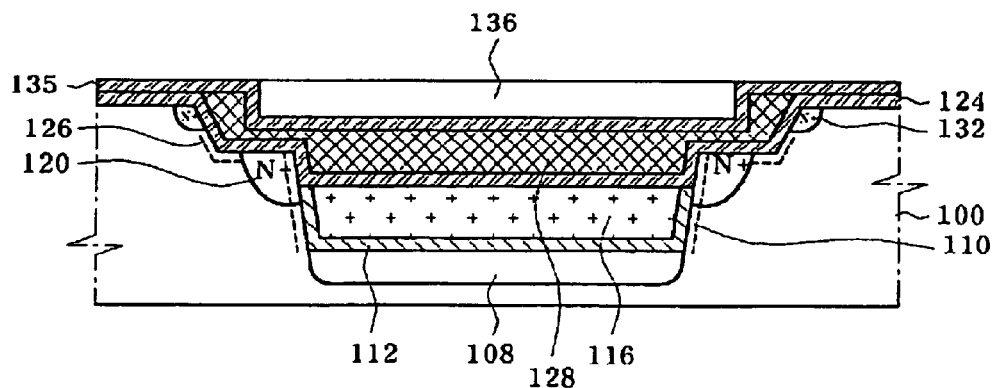
Figure 2O:
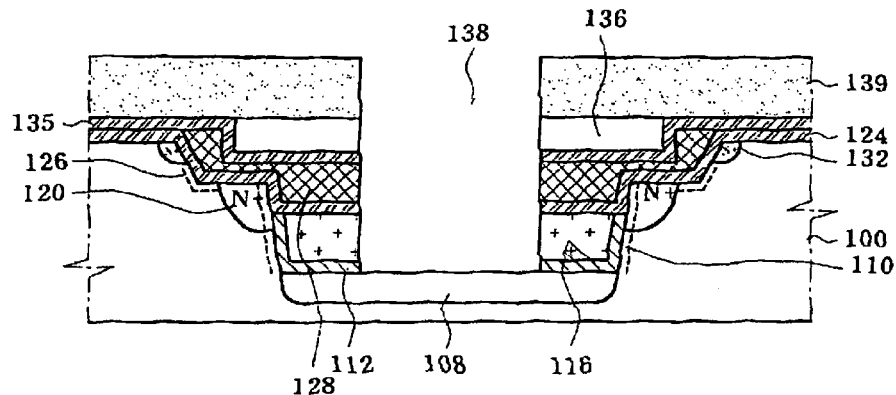
Figure 2P:
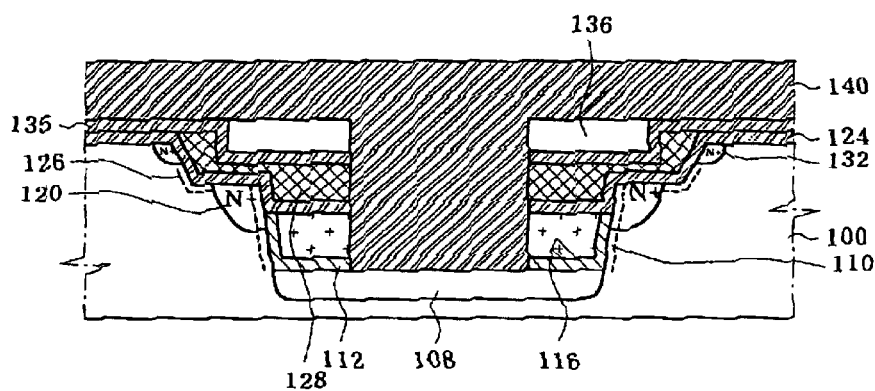
Figure 2Q:
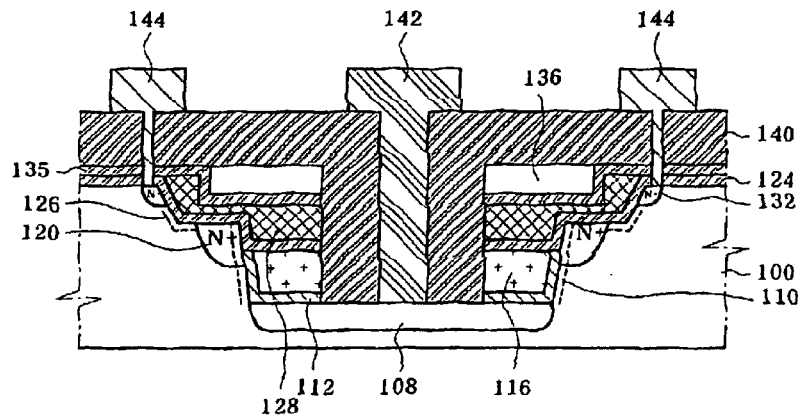
Figure 2R:
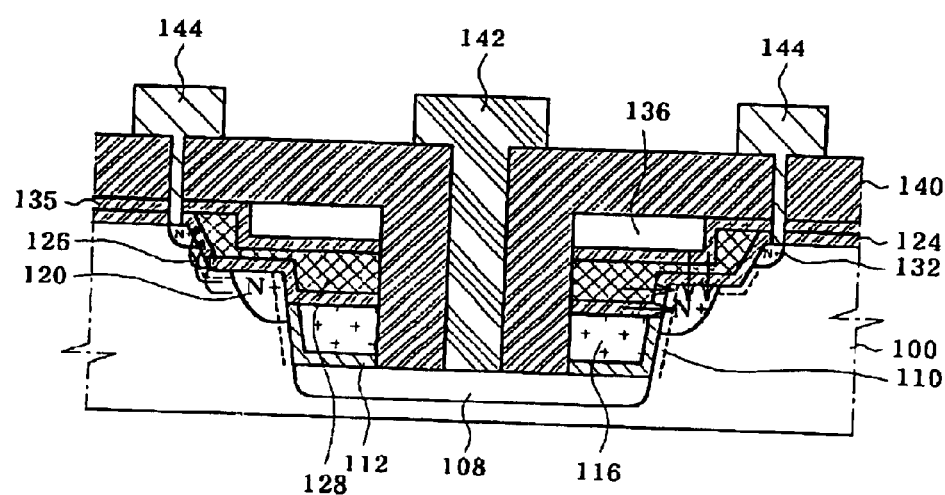

FIGS. 2a to 2r are cross sectional views for explaining a method for manufacturing a nonvolatile memory transistor according to a preferred embodiment of the present invention.

Firstly, as shown in FIG. 2a, a photoresist layer 102 of a predetermined shape is formed on a silicon substrate 100. Next, using the photoresist layer 102 of the predetermined shape as a mask, the silicon substrate 100 is etched to a predetermined depth, to thus form a trench 104. Upon etching the silicon substrate 100, it is preferred to perform etching so that an etched region is not inclined much by forming a right angle if possible.

Continuously, as shown in FIG. 2b, in order to form a N+ source junction of a NVM cell, ion implantation is performed using a N-type dopant, to thus form a N+ type doped region 108.

In the next step, as shown in FIG. 2c, without removing the first photoresist layer 102 having a predetermined shape, an additional etching of the silicon substrate 100 is performed. This silicon etching is performed in order to etch the N-type doped region ion-implanted to the sides of the trench 104 in FIG. 2b. The silicon-etched sides form a channel portion of a select transistor later:

And, as shown in FIG. 2d, for the ion implantation for threshold voltage Vt control of the select transistor, an inclined ion implantation is carried out, to form ion implanted regions 110 on the sides of the trench 104.

Continuously, as shown in FIG. 2e, an oxide film 112 is deposited, then poly-serving as a gate node of the select transistor is deposited to form a poly-1 layer 116, and then a POCL3 doping is performed for doping poly-1 (or N type ions are implanted, doped and annealed).

Continually, as shown in FIG. 2f, the poly-1 layer 116 is formed, and an etchback is performed to the poly-1 layer 116. It is preferred to perform the etchback so that the etchback amount can be about one thirds of the thickness of the silicon-etched surface.

Then, as shown in FIG. 2g, a second photoresist 118 having a predetermined shape is formed. Then, in order to form an N+ source junction of a cell transistor, an N-type ion implantation is performed to obtain N+ ion implanted regions 120.

In the next step, as shown in FIG. 2h, the second photoresist having the predetermined shape is removed, and then a third photoresist 122 having a predetermined shape is formed in order to perform an additional silicon etching. Continuously, using the third photoresist 122 having the predetermined shape as a mask, the silicon substrate 100 is additionally etched to form a channel of an EEPROM.

And, as shown in FIG. 2i, due to a stepped portion between the surface of the silicon wafer and the etched back poly-1 layer 116 in the silicon etching, a stepped portion is formed between the N+ source junction of the cell and the poly-1 after the etching. Next, ion implantation is performed to control the threshold voltage Vt of the channel of the cell to thus form cell threshold voltage ion implanted regions 123.

Continually, as shown in FIG. 2j, after the cell threshold voltage ion implantation, the gate oxidation of the cell is performed to form a cell gate oxide film 124.

In the next step, as shown in FIG. 2k, poly-2 is deposited, and then etched back to form a poly-2 layer 128. The poly-2 layer 128 is utilized later as a floating poly of the cell, and, after the poly-2 deposition, the doping for the poly-2 is carried out by conducting a POCL3 or N-type ion implantation and then annealing.

In the next step, as shown in FIG. 2l, a fourth photoresist 130 having a predetermined shape is coated, and then ion implantation is carried out for forming a cell N-type drain junction, thereby forming cell N-type drain junction regions 132.

And, as shown in FIG. 2m, a fifth photoresist 134 having a predetermined shape is coated, and then the poly-2 layer 128 is etched into a predetermined shape so as to form a control gate of the cell overlapped with the poly-2.

Continually, as shown in FIG. 2n, an oxide film 135 is deposited, and then poly-3 is deposited. Then, an etchback process is conducted to form a poly-3 layer 136. In this case, a doping is performed also by conducting a POCL3 or N-type ion implantation and then annealing for the purpose of doping. Such the poly-3 layer 135 serves as a control gate node of the cell later. Then, as shown in FIG. 2o, a sixth photoresist 139 having a predetermined shape is formed, and then, using the sixth photoresist 139 having the predetermined shape as a mask, the poly-3 layer 136, the oxide film 135, the poly-2 layer 128, the cell gate oxide film 124, the etched back poly-1 layer 116 and the oxide film 112 are simultaneously etched to form a trench 138.

In the next step, as shown in FIG. 2p, an oxide film 140 is filled in the trench 138.

Continually, as shown in FIG. 2r, a finally completed cross sectional view is illustrated.

The operation of the EEPROM structure for program, erase and read is shown in the following Table 2.

TABLE 2

| Condition | V_drain | V_select gate | V_control gate | V_source | V_sub | Method |
|---|---|---|---|---|---|---|
| Program | Vcc | Higher than ~10 V | Higher than ~10 V | GND | GND | HCI |
| Erase | Floating | Higher than ~10 V | Higher than ~10 V | Higher than ~10 V | GND | F-N Tunneling |
| Read | ~1 V | Vcc | Vcc | GND | GND | — |

As described above, the present invention relates to a method for manufacturing a nonvolatile memory transistor, and can provide an EEPROM memory, which is capable of minimizing the area when adapted to the technology for sub-micron.

The invention may be embodied in other forms without departing from the spirit or essential characteristics thereof. The embodiment disclosed in this application is to be considered as illustrative and not limiting. The scope of the invention is indicated by the appended claims rather than by the foregoing description, and all modifications, which come within the meaning and range of equivalency of the claims, are intended to be embraced therein.

What is claimed is:

1. A method for manufacturing a nonvolatile memory transistor, comprising the steps of:

forming a trench of a predetermined shape on a silicon substrate;

forming a N+ type doped region;

etching the silicon substrate;

forming ion implanted regions on the sides of the trench by conducting an inclined ion implantation for threshold voltage Vt control ion implantation of a select transistor;

forming a poly-1 layer by depositing an oxide film and then depositing poly-1 serving as a gate node of the select transistor, conducting an etchback to the poly-1 layer; after the formation of the poly-1 layer, forming N+ ion implanted regions by conducting a N-type ion implantation in order to form a N+ source junction of a cell transistor, forming a channel of an EEPROM by additionally etching the silicon substrate;

forming cell threshold voltage ion implanted regions by conducting an ion implantation in order to control the threshold voltage Vt of the channel of the cell transistor;

forming a cell gate oxide film by conducting the gate oxidation of the cell transistor; after the cell transistor threshold voltage ion implantation, forming a poly-2 layer by depositing poly-2 and then conducting an etchback;

forming cell N-ype drain junction regions by conducting an ion implantation in order to form a cell N-type drain junction;

etching the poly-2 layer into a predetermined shape in order to form a control gate of the cell transistor overlapped with the poly-2;

forming a poly-3-layer by depositing an oxide film, depositing poly-3 and conducting an etchback; and filling an oxide film so as to be penetrated into the poly-3 layer, the oxide film, the poly-2 layer, the cell gate oxide film, the poly-1 layer and the oxide film under the poly-1 layer.

2. The method of claim 1, wherein the etchback of the poly-1 layer is performed so that the etchback amount can be about one thirds of the thickness of the silicon etched surface.

3. The method of claim 1, wherein the etching of the silicon substrate is performed so that an etched region forms a right angle.

* * * * *

UNITED STATES PATENT AND TRADEMARK OFFICE
CERTIFICATE OF CORRECTION

PATENT NO. : 6,846,713 B1
DATED : January 25, 2001
INVENTOR(S) : Da-Soon Lee

It is certified that error appears in the above-identified patent and that said Letters Patent is hereby corrected as shown below:

Title page,
Item [57], ABSTRACT,
Line 4, after "methods comprises the" please delete "steps of forming" and insert -- steps of: forming -- in its place.
Line 11, after "of the select" please delete "transistor, after" and insert -- transistor; after -- in its place.
Line 13, after "poly-1" please delete "layer, forming" and insert -- layer, forming -- in its place.

Column 4,
Line 62, after "select" please delete "transistor," and insert -- transistor; -- in its place.
Line 67, after "of a cell" please delete "transistor," and insert -- transistor; -- in its place.

Signed and Sealed this

Fifth Day of July, 2005

JON W. DUDAS
*Director of the United States Patent and Trademark Office*